United States Patent
Fox et al.

(10) Patent No.: US 8,457,920 B2
(45) Date of Patent: Jun. 4, 2013

(54) PERFORMANCE IMPROVEMENT FOR A MULTI-CHIP SYSTEM VIA KERF AREA INTERCONNECT

(75) Inventors: Benjamin A. Fox, Rochester, MN (US); Nathaniel J. Gibbs, Rochester, MN (US); Andrew B. Maki, Rock, MN (US); Trevor J. Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 12/789,669

(22) Filed: May 28, 2010

(65) Prior Publication Data
US 2011/0295543 A1    Dec. 1, 2011

(51) Int. Cl.
*G01R 31/28*   (2006.01)

(52) U.S. Cl.
USPC ................................................... 702/118

(58) Field of Classification Search
CPC ........................................................ G01R 31/28
USPC ............................................. 702/118, 117, 120
See application file for complete search history.

(56) References Cited

U.S. PATENT DOCUMENTS

| | | | | |
|---|---|---|---|---|
| 3,849,872 A | * | 11/1974 | Hubacher | 438/17 |
| 5,596,226 A | * | 1/1997 | Beilstein et al. | 257/690 |
| 6,192,289 B1 | * | 2/2001 | Geffen et al. | 700/121 |

* cited by examiner

*Primary Examiner* — Bryan Bui
(74) *Attorney, Agent, or Firm* — Jim Boice

(57) ABSTRACT

A semiconductor wafer comprises a first chip and a second chip, each chip comprising a core, link layer and physical layer. A kerf area physically connects the two chips on the wafer, and a kerf area interconnect selectively couples the link layers of the two chips while the two physical layers are disabled.

6 Claims, 5 Drawing Sheets

PERFORMANCE IMPROVEMENT FOR A MULTI-CHIP SYSTEM VIA KERF AREA INTERCONNECT

BACKGROUND

The present disclosure relates to the field of computer chips, and specifically to the manufacturing of computer chips. Still more particularly, the present disclosure relates to computer chips that are selectively interconnected via a kerf area interconnect.

BRIEF SUMMARY

In one embodiment of the present disclosure, a semiconductor wafer comprises a first chip and a second chip, each chip comprising a core, link layer and physical layer. A kerf area physically connects the two chips on the wafer, and a kerf area connector selectively couples the link layers of the two chips while the two physical layers are disabled.

In one embodiment of the present disclosure, a computer implemented method and computer program product selectively couple multiple chips via respective link layers. A first chip and a second chip on a semiconductor wafer are tested. Each chip has a selective switch between a link layer and a physical layer on each chip. In response to the first chip and the second chip both passing the testing, the selective switches decouple the link layers from the physical layers of the chips while coupling the link layers in each of the two chips.

DETAILED DESCRIPTION

Figure 1:
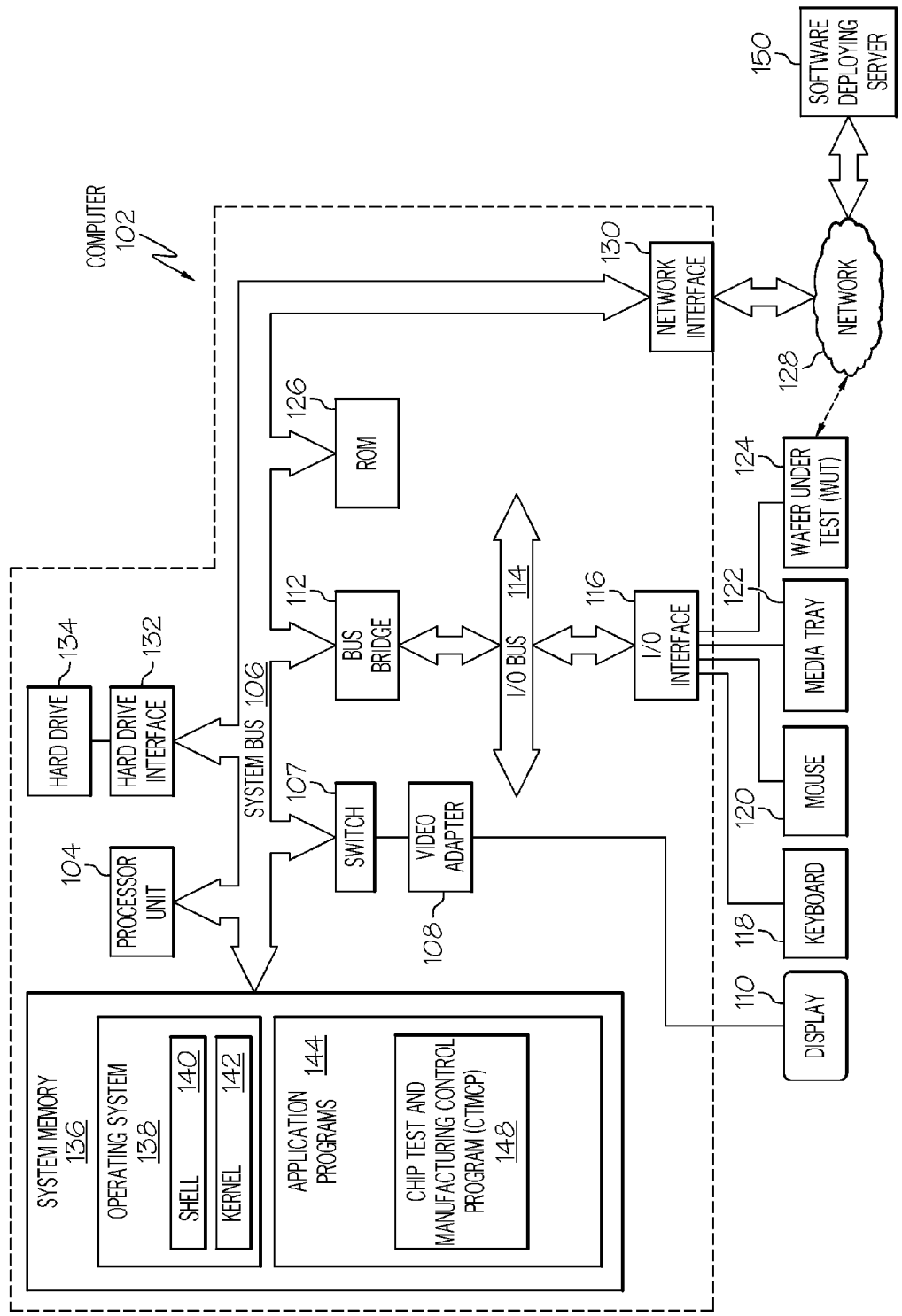
FIG. 1 depicts an exemplary computer in which the present disclosure may be implemented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular to FIG. 1, there is depicted a block diagram of an exemplary computer 102, which may be utilized by the present invention. Note that some or all of the exemplary architecture, including both depicted hardware and software, shown for and within computer 102 may be utilized by software deploying server 150.

Computer 102 includes a processor 104 that is coupled to a system bus 106. Processor 104 may utilize one or more processors, each of which has one or more processor cores. A video adapter 108, which drives/supports a display 110, is also coupled to system bus 106. In one embodiment, a switch 107 couples the video adapter 108 to the system bus 106. Alternatively, the switch 107 may couple the video adapter 108 to the display 110. In either embodiment, the switch 107 is a switch, preferably mechanical, that allows the display 110 to be coupled to the system bus 106, and thus to be functional only upon execution of instructions (e.g., chip test manufacturing control program—CTMCP 148 described below) that support the processes described herein.

Figure 3:
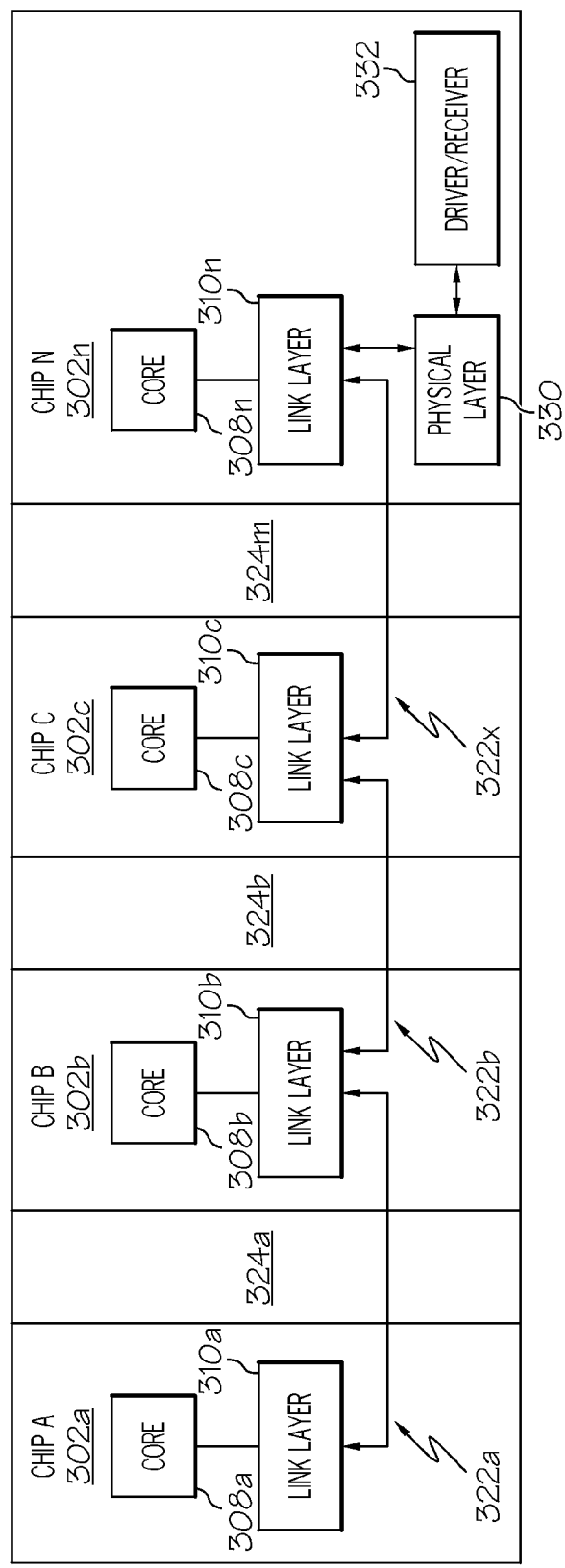
FIG. 3 depicts multiple chips coupled by multiple kerf area interconnects.
Figure 4:
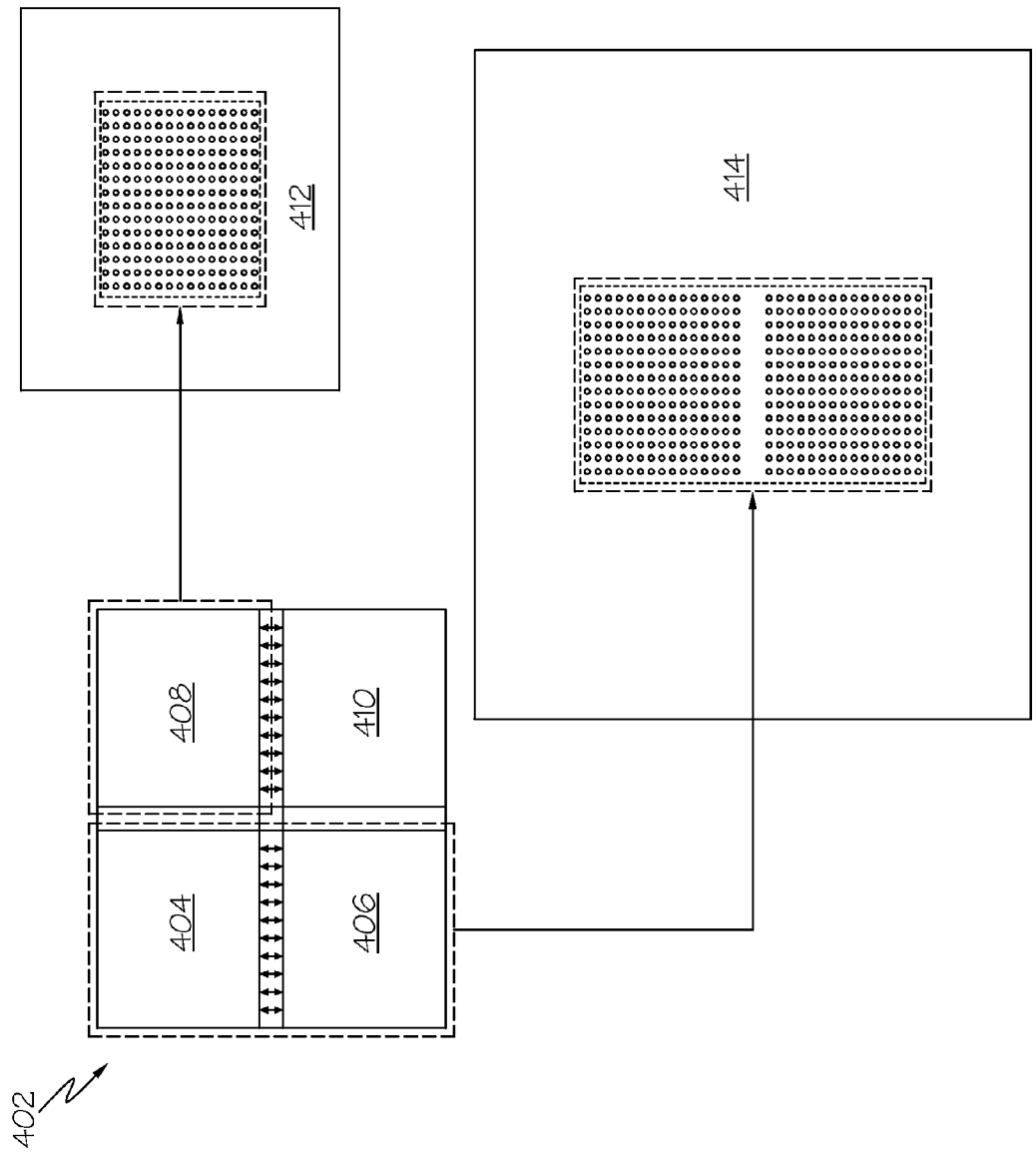
FIG. 4 illustrates a chips being selectively mounted onto single or multiple chip sockets.

System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), and a wafer under test (WUT) 124, which is a wafer on which is printed multiple chips such as those depicted in FIG. 2-4. While the format of the ports connected to I/O interface 116 may be any known to those skilled in the art of computer architecture, in a preferred embodiment some or all of these ports are universal serial bus (USB) ports. Also coupled to system bus 106 is a read only memory (ROM) 126, which is a static (and optionally programmable—PROM and/or erasable—EPROM) memory used to store boot programs and other static information.

As depicted, computer 102 is able to communicate with a software deploying server 150, and optionally WUT 124, via network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 in computer 102's system memory (as well as software deploying server 150's system memory) include a chip test manufacturing control program (CTMCP) 148. CTMCP 148 includes code for implementing the processes described below, including those described in FIGS. 2-5. In one embodiment, computer 102 is able to download CTMCP 148 from software deploying server 150, including in an on-demand basis, wherein the code in CTMCP 148 is not downloaded until needed for execution to define and/or implement the improved enterprise architecture described herein. Note further that, in one embodiment of the present invention, software deploying server 150 performs all of the functions associated with the present invention (including execution of CTMCP 148), thus freeing computer 102 from having to use its own internal computing resources to execute CTMCP 148.

The hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Figure 2:
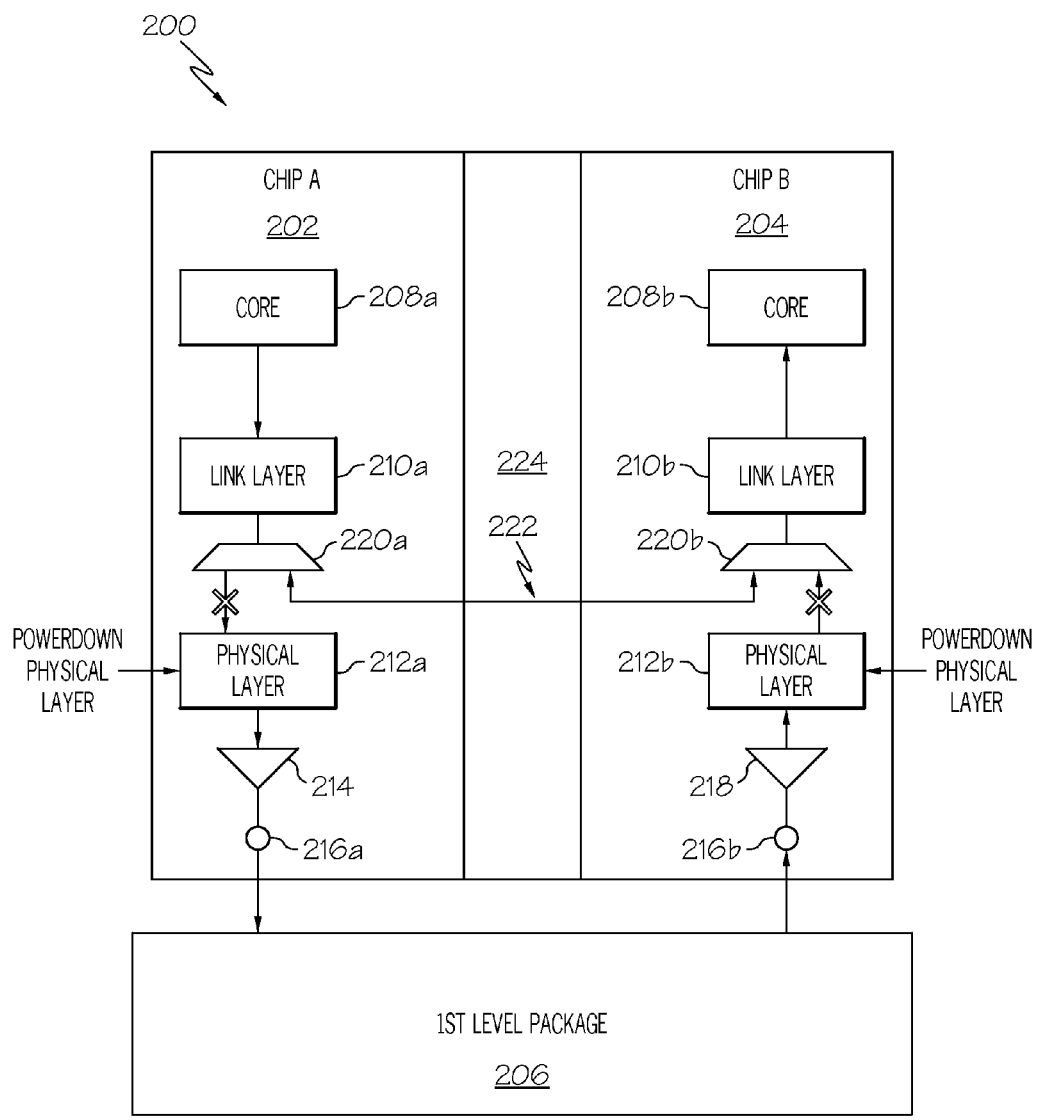
FIG. 2 illustrates an exemplary pair of chips coupled by a kerf area interconnect.

Referring now to FIG. 2, a portion of a wafer 200 is depicted. In a default design, Chip A (chip 202) and Chip B (chip 204) are structured to interact and communicate via a first level package 206 (e.g., using a socket on a printed circuit board) in the following manner. Each of the chips 202 and 204 has a core 208$a/b$, a link layer 210$a/b$, and a physical layer 212$a/b$. Each of the cores 208$a$-$b$ contain hardware logic for executing instructions through the use of data buffers, execution units, branching logic, load-store units (LSUs), etc. That is, the cores 208$a$-$b$ perform the actual data processing. In order to communicate data and instructions to and from the cores 208$a$-$b$, link layers 210$a$-$b$ contain hardware that supports the implementation of Layer 2 in the seven-layer open system interconnection (OSI) model for communication protocols. More specifically Layer 2 describes and supports the type of communication system (logical link control-LLL, media access control-MAC, Ethernet, etc.) used to transport data/instructions.

The physical layers 212$a$-$b$ are hardware that support the implementation of Layer 1 of the OSI model, such as defining/supporting data rates, slew rates, voltage levels, etc. required for the protocol defined by/selected from link layers 210$a$-$b$.

When communicating from chip 202 to chip 204, data passes from core 208$a$ through link layer 210$a$ and physical layer 212a to an off chip driver 214. The off chip driver 214 drives the communicated data onto a connector 216a, which is a connection point to the first level package 206. The data passes through the first level package 206 to chip 204 via another connector 216b, to which is attached an off-chip receiver 218 that receives the data. The received data is then passed up through the physical layer 212b and link layer 210b to the core 208b of chip 204. Note that passing data through the first level package 206 takes a long time (e.g., several nanoseconds or longer). Thus, the present disclosure introduces a new component, switches 220a-b and a kerf area interconnect 222, which passes across a kerf area 224.

As depicted, chip 202 and chip 204 are physically connected by a kerf area 224, all of which are part of the original wafer. Kerf area 224 derives its name from the kerf, which is the area where no material would remain if chip 202 and chip 204 were to be cut apart. That is, "kerf" derives its name from the spacing left from a saw blade after cutting through any material. The area that is removed by such cutting (done on wafers by lasers, etc.) is referred to as the "kerf area" or, colloquially, as simply the "kerf". Again, note that as depicted in FIG. 2, kerf area 224 describes the area where material still remains, thus physically connecting chip 202 to chip 204.

Between the link layers 210a-b and physical layers 212a-b are switches 220a-b, which are depicted in exemplary manner as multiplexers/demultiplexers. In accordance with the present disclosure under test conditions described below, the link layers 210a and 210b of respective cores 208a and 208b are selectively and directly coupled via switches 220a-b and kerf area interconnect 222. More specifically, when so instructed, switch 220a decouples link layer 210a from physical layer 212a, while coupling link layer 210a to the kerf area interconnect 222. At or near the same time, switch 220b decouples link layer 210b from physical layer 212b, while allowing link layer 210b to be directly coupled to kerf area interconnect 222, and thus link layer 210a. This bypass connection results in much faster intercommunication between core 208a and core 208b. As described below, the switches 220a-b are so activated in response to chip 202 and chip 204 both passing a performance test of at least cores 208a-b and link layer 210a-b.

As shown in FIG. 2, bypassing the physical layers 212a-b and connectors 216a-b removes the ability of chips 202 and 204 to connect to the first level package 206, thus limiting their usefulness. In accordance with one embodiment of the present disclosure, there are two chips (such as shown in FIG. 2) under test. In accordance with another embodiment, many chips are under test, such as chips 302a-n (where "n" is an integer), shown in FIG. 3. Each of the chips 302a-n have a corresponding core from cores 308a-n and a link layer 310a-n, which respectively are similar to the cores 208a-b and link layers 210a-b shown in FIG. 2. As in FIG. 2, the chips 302a-n are physically connected by kerf areas 324a-m (where "m" is an integer), and are electrically connected via kerf area interconnects 322a-x (where "x" is an integer). Note that one of the chips (chip 302n) also has a physical layer 330 and a driver/receiver 332, which are used to connect chip 302n to a first level package via a set of connectors (not shown). Note that the data communication among the chips 302a-n is greatly improved, since there is no need to push data through a physical layer and/or package when such intercommunication is performed.

One embodiment of the present disclosure utilizes the selectively switched direct communication between link layers to improve yield from a wafer. For example, consider wafer 402 shown in FIG. 4. Assume that wafer 402 is a device under test (e.g., WUT 124 shown in FIG. 1), and that chips 404, 406, and 408 passed the test, but chip 410 failed. Assume also that chips 404-410 have the same architecture as that shown in FIG. 2 for chips 202/204). Dicing out chip 408 allows it to be mounted on a single chip module 412, while leaving its physical layer, off-chip driver, and connector intact. That is, the switch (e.g., switch 220a shown in FIG. 2) is blown such that the connection to kerf area interconnect 222 is severed, while the connection to physical layer 212a remains intact.

However, dicing out chips 404 and 406 into a single unit (such that the kerf area between them remains while the kerf area between chip 404 and chip 408, and between chip 406 and chip 410 is removed) results in chips 404/406 being mounted onto a dual chip module 414. In response to determining that these two adjacent chips (404/406) both passed their performance tests, their switches (e.g., switches 220a/b shown in FIG. 2) are blown such that their normal physical layers 212a-b are severed, and their respective link layers 210a/b are directly coupled by the kerf area interconnect 222). This direct link layer to link layer connections results in a dual core chip (404/406) that is much faster that a dual core chip that has to intercommunicate via the chip module (first level package).

Figure 5:
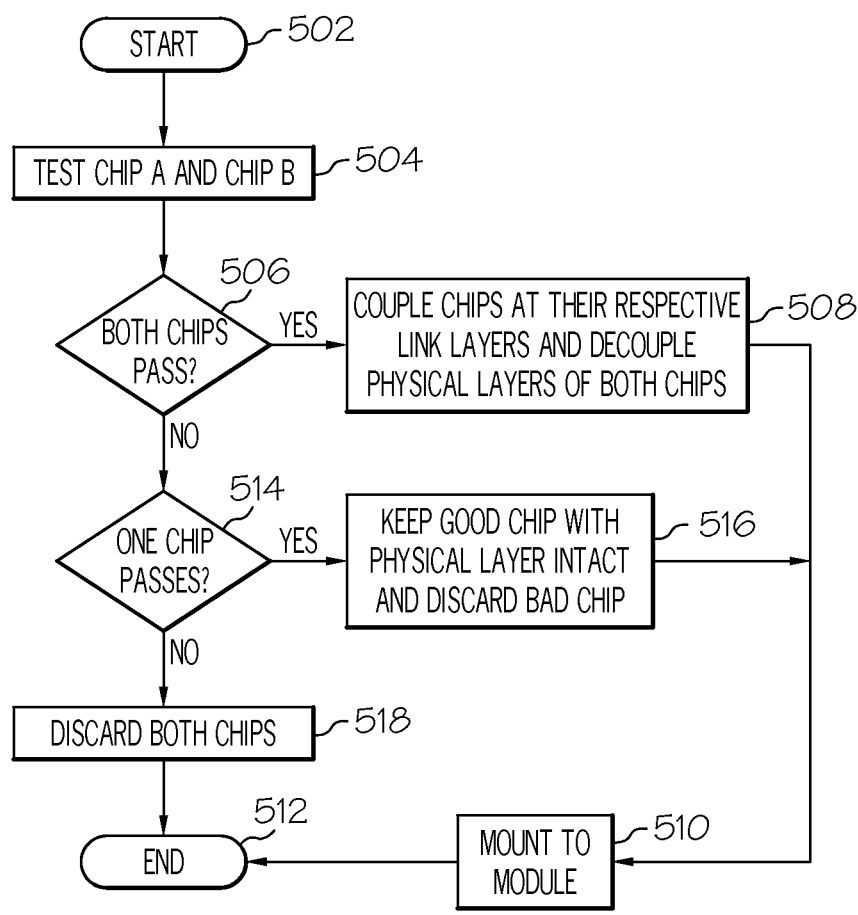
FIG. 5 is a high level flow chart of one or more exemplary steps taken by a processor to selectively couple two or more chips via their respective link layers.

With reference now to FIG. 5, a high level flow chart of one or more exemplary steps taken by a processor to selectively couple two or more chips via their respective link layers is presented. After initiator block 502, Chip A and Chip B are tested (block 504). Note that multiple contiguous chips may actually be tested, in order to take advantage of the embodiment shown in FIG. 3. However, for the sake of clarity in the example presented, assume that only two chips are being tested.

If both chips pass their tests (query block 506), then their internal switches (e.g., switches 220a/b shown in FIG. 2) are blown (block 508) such that their normal physical layers (212a-b) are severed, and their respective link layers (210a/b) are directly coupled by the kerf area interconnect (222). This results in the link layers in each of the chips being decoupled from the physical layers in the chips. This permits the two chips that passed to be mounted onto a dual chip module as a dual-core chip with improved inter-core data communication speeds (block 510). The process thus ends at terminator block 512.

However, if only one of the chips passes (query block 514), then the good chip (that passed the test) is diced out with its physical layer still intact and coupled to its link layer (block 516), allowing it to be coupled to a single chip module (block 510). If both chips fail their tests (query block 514), then they are simply discarded/recycled/etc. (block 518). The process ends at terminator block 512.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the invention of the present application in detail and by reference to illustrative embodiments thereof, it will be apparent that modifications and variations are possible without departing from the scope of the invention defined in the appended claims.

What is claimed is:

1. A semiconductor wafer comprising;
a first chip comprising a first core, a first link layer and a first physical layer;
a second chip comprising a second core, a second link layer and a second physical layer;
a first kerf area physically connecting the first chip to the second chip; and
a first kerf area interconnect selectively coupling the first link layer to the second link layer, wherein selectively coupling the first link layer to the second link layer results in the first physical layer and the second physical layer being disabled, wherein the first physical layer is disabled by decoupling the first physical layer from the first link layer in the first chip, and wherein the second physical layer is disabled by decoupling the second physical layer from the second link layer in the second chip.

2. The semiconductor wafer of claim 1, further comprising:
a first switch between the first link layer and the first physical layer; and
a second switch between the second link layer and the second physical layer, wherein the first switch and the second switch selectively couple the first link layer to the second link layer via the first kerf area interconnect, and wherein the first switch and the second switch respectively disable the first physical layer and the second physical layer.

3. The semiconductor wafer of claim 2, wherein the first switch is a first multiplexer and the second switch is a second multiplexer.

4. The semiconductor wafer of claim 1, further comprising:
a third chip comprising a third core, a third link layer and a third physical layer;
a second kerf area physically connecting the second chip to the third chip; and
a second kerf area interconnect selectively coupling the second link layer to the third link layer, wherein selectively coupling the second link layer to the third link layer enables the first link layer, the second link layer and the third link layer to electrically communicate with a circuit board via the third physical layer.

5. A computer implemented method of selectively coupling multiple chips via respective, link layers, the computer implemented method comprising:
testing a first chip on a wafer, wherein the first chip comprises a first core, a first link layer, and a first selective switch coupling the first link layer to a first physical layer;
testing a second chip on the wafer, wherein the second chip comprises a second core, a second link layer, and a second selective switch coupling the second link layer to a second physical layer; and
in response to the first chip and the second chip both passing said testing, instructing the first selective switch to decouple the first link layer from the first physical layer, instructing the second selective switch to decouple the second link layer from the second physical layer, and instructing the first selective switch and the second selective switch to couple the first link layer to the second link layer via a kerf area interconnect.

6. A computer program product for selectively coupling multiple chips, via respective link layers, the computer program product comprising:
a non-transitory computer readable storage media;
first program instructions to test a first chip on a wafer, wherein the first chip comprises a first core, a first link layer, and a first selective switch coupling the first link layer to a first physical layer;
second program instructions to test a second chip on the wafer, wherein the second chip comprises a second core, a second link layer, and a second selective switch coupling the second link layer to a second physical layer; and
third program instructions to, in response to the first chip and the second chip both passing said testing, instruct the first selective switch to decouple the first link layer from the first physical layer, instruct the second selective switch to decouple the second link layer from the second physical layer, and instruct the first selective switch and the second selective switch to couple the first link layer to the second link layer via a kerf area interconnect, and wherein the first, second and third program instructions are stored on the non-transitory computer readable storage media for execution by a processor via a system memory.

* * * * *